United States Patent [19]

Van Zanten et al.

[11] Patent Number: 4,947,380
[45] Date of Patent: Aug. 7, 1990

[54] MULTI-MODE MEMORY DEVICE

[75] Inventors: Adrianus T. Van Zanten; Hendrikus J. M. Veendrick; Frits A. Steenhof; Peter H. Frencken; Antonius H. H. J. Nillesen; Cornelis G. L. M. Van Der Sanden, all of Eindhoven, Netherlands

[73] Assignee: U.S. Philips Corporation, New York, N.Y.

[21] Appl. No.: 208,186

[22] Filed: Jun. 16, 1988

[30] Foreign Application Priority Data

Jun. 16, 1987 [NL] Netherlands ............... 8701392

[51] Int. Cl.$^5$ .................. G11C 7/00; G11C 11/42
[52] U.S. Cl. ..................... 365/238; 365/78; 365/189.12
[58] Field of Search ........... 365/189.12, 219, 220, 365/73, 78, 238, 240, 233, 183, 239

[56] References Cited

U.S. PATENT DOCUMENTS

| | | | |
|---|---|---|---|
| 4,103,347 | 7/1978 | Barton | 365/219 |
| 4,150,364 | 4/1979 | Baltzer | 365/220 X |
| 4,225,947 | 9/1980 | Councill et al. | 365/189.12 |
| 4,663,735 | 5/1987 | Novak et al. | 365/233 X |
| 4,679,083 | 7/1987 | Schmitz | 358/147 |
| 4,680,738 | 7/1987 | Tam | 365/240 X |
| 4,747,081 | 5/1988 | Heilveil et al. | 365/240 X |
| 4,796,231 | 1/1989 | Pinkham | 365/189.12 |

OTHER PUBLICATIONS

Berkhoff et al., "Applications of Picture Memories in Television Receivers", IEEE Trans. Consum. Elec., vol. CE-29, No. 3, Aug. 1983, pp. 251-258.

Primary Examiner—Stuart N. Hecker
Assistant Examiner—Alyssa H. Bowler
Attorney, Agent, or Firm—Thomas A. Briody; Jack E. Haken; Anne E. Barschall

[57] ABSTRACT

The invention relates to a memory device of the charge-coupled shift register type which is subdivided into four sections each of which has a storage capacity of, for example 208,800 bits and which can operate in different modes: parallel-in/parallel-out (as background video memory); 2×2 parallel-in, demultiplex/multiplex mode, for example for 100 Hz TV; scan mode; parallel-in-recirculation mode; "shortened" memory, for example for 525-line system, etcetera. Control is realized via a decoding and timing block in which a multi-bit control word is serially input and decoded. In a scan mode (for example, as a teletext memory), the memory sections are scanned one-by-one under the control of a separate scan register in which a scan bit (logic 1) is step-wise shifted until all sections have been read. Via a data output, the scan bit is transferred, for example to the scan register of a further memory device (via its serial data input) which is connected in series with the former memory device.

11 Claims, 6 Drawing Sheets

TABEL I

|  | 8-21 | 8-22 | 8-23 | 8-24 | 8-25 | 8-26 | 8-27 |
|---|---|---|---|---|---|---|---|
| START OUTPUT | 0 | 1 | 1 | 1 | 1 | 1 | 1 |
| START INPUT | 1 | 1 | 1 | 1 | 1 | 1 | 0 |
| DATA IN A/B | 0 | 1 | * | * | * | * | * |
| MUXED DATA | 0 | * | 1 | * | * | * | * |
| SERIAL MODE | 0 | * | * | 1 | * | * | * |
| Hi Z | 0 | * | * | * | 1 | * | * |
| 258 / 290 Lines | 0 | * | * | * | * | 1 | * |

TABEL II

| $\overline{SWR}$ | 0 | 0 | 0 | 0 | 0 | 0 | 0 | 1 | 1 | 1 | 1 | 1 | 1 | 1 |
|---|---|---|---|---|---|---|---|---|---|---|---|---|---|---|
| 8 - 61 | 0 | 0 | 0 | 0 | 1 | 1 | 1 | 0 | 0 | 0 | 0 | 1 | 1 | 1 |
| 8 - 63 | 0 | 0 | 1 | 1 | 0 | 0 | 1 | 0 | 0 | 1 | 1 | 0 | 0 | 1 |
| 8 - 64 | 0 | 1 | 0 | 1 | 0 | 1 | 1 | 0 | 1 | 0 | 1 | 0 | 1 | 0 |
| SWIi-1 | 1 | 1 | 1 | 1 | 1 | 1 | 1 | 0 | 0 | 0 | 0 | 0 | 1 | 1 |
| SWIi-2 | 0 | 0 | 0 | 0 | 0 | 0 | 0 | 0 | 0 | 0 | 1 | 0 | 0 | 0 |
| SWIi-3 | 0 | 0 | 0 | 0 | 0 | 0 | 0 | 0 | 0 | 0 | 0 | 1 | 0 | 0 |
| SWIi-4 | 0 | 0 | 0 | 0 | 0 | 0 | 0 | 1 | 1 | 1 | 1 | 0 | 0 | 0 |
| SWR-1 | 1 | 1 | 1 | 1 | 0 | 0 | 0 | 0 | 0 | 0 | 0 | 0 | 0 | 0 |
| SWS-2 | 1 | 1 | 1 | 1 | 0 | 0 | 0 | 0 | 0 | 0 | 0 | 0 | 0 | 0 |
| SWST-2 | 0 | 0 | 0 | 0 | 0 | 0 | 0 | 0 | 0 | 0 | 1 | 0 | 0 | 0 |

FIG. 8b

MULTI-MODE MEMORY DEVICE

The invention relates to a multi-mode memory device of the charge-coupled shift register type for the storage of picture information, which memory device is subdivided into a plurality of series/parallel/series-organized memory sections which, at least in a first and in a second mode of the memory device, are connected in a recirculation mode and in a serial mode, respectively, for which purpose there are provided switching means.

A memory device of this kind is described in European Patent Application No. 0,118,950. The memory device described therein is used in a teletext background memory in a television receiver. Said recirculation mode is a necessity for a memory of the charge-coupled shift register type, because therein the information is stored in capacitances. Because the capacitances have the property that charge is dissipated, the charge must be replenished within a given minimum period of time. This is realized during the recirculation of the information. In the second mode of the memory device, in which the memory sections are connected in series, information is written. In a read mode, one of the series/parallel/series-organized memory sections of the memory device is read. This can be performed during the recirculation of the information in the memory section for the replenishment of the information stored in a memory cell.

The described memory device of the charge-coupled shift register type is used in a teletext application. A further specific application of such memories is described inter alia in the article "Applications of picture memories in television receivers" by E. J. Berkhoff et al, IEEE Transactions on Consumer Electronics, Vol. CE-29, No. 3, Aug. 1983, pages 251–258. As described in the cited article, instead of teletext information video information can be stored in various 308-kb memory sections. Each memory section is formed by an integrated memory composed of eight series-parallel-series memory sections in which the applied information is written in demultiplexed form. Consequently, the processing of video information requires not only said memory sections but also further switching means for conducting the information to the appropriate memory sections. It is apparent from the cited article by E. J. Berkhoff that memories of the charge-coupled shift register type are used in various applications such as (multi) picture in picture, stationary (frozen) picture, reduction of large area flicker, noise reduction, reduction of cross colours and cross luminance. In the various applications the information is stored and processed in various ways. Therefore, appropriate control must be provided for these memories in order to ensure correct operation.

It is an object of the invention to provide a memory device of the charge-coupled shift register type which enables universal use. It is a further object of the invention to provide a multi-purpose memory device of the kind set forth in which the switching means required for adjusting the different modes are restricted to an acceptable level. To achieve this, the memory device in accordance with the invention is characterized in that the memory device is fully integrated with the switching means, which switching means comprise a decoding and timing circuit for receiving a control word serially applied to an input terminal of the integrated memory device and for switching the integrated memory device to a mode which is determined by the control word, and also comprises a parallel-in/parallel-out mode, each memory section having its own input terminal and output terminal. Besides the addition of the parallel-in/parallel-out mode, for which purpose the memory device comprises an additional input terminal and output terminal for each memory section, a decoding and timing circuit for receiving a control word serially applied to an input terminal is also included in the memory device. The control word stored is decoded by the decoding circuit and the memory device is switched to the mode determined by the control word. Despite the increase of the number of input terminals and output terminals for the parallel-in/parallel-out mode, the total number of connection pins is limited because the mode selection is performed by serially applying a control word to the memory device.

A further embodiment of the memory device in accordance with the invention is characterized in that the memory device has a demultiplex/multiplex mode, data applied to an input terminal being successively applied to at least two memory sections which can also be read in the multiplex mode and whose stored data is successively applied to an output terminal. A memory device of this kind can be very attractively used in, for example 100 Hz television (conversion frame frequency from 50 Hz to 100 Hz).

Embodiments in accordance with the invention will be described in detail hereinafter, by way of example, with reference to the drawing; therein:

FIG. 1 shows a block diagram of an integrated memory device in accordance with the invention, FIG. 2 shows a block diagram of the memory device in the time multiplex mode, FIG. 3 shows a time diagram of various signals occurring in the memory device shown in FIG. 2, FIG. 4 shows a block diagram of a circuit for generating internal clock pulses, FIG. 5 shows a time diagram of various signals occurring in the circuit for generating internal clock signals;

Figure 1:
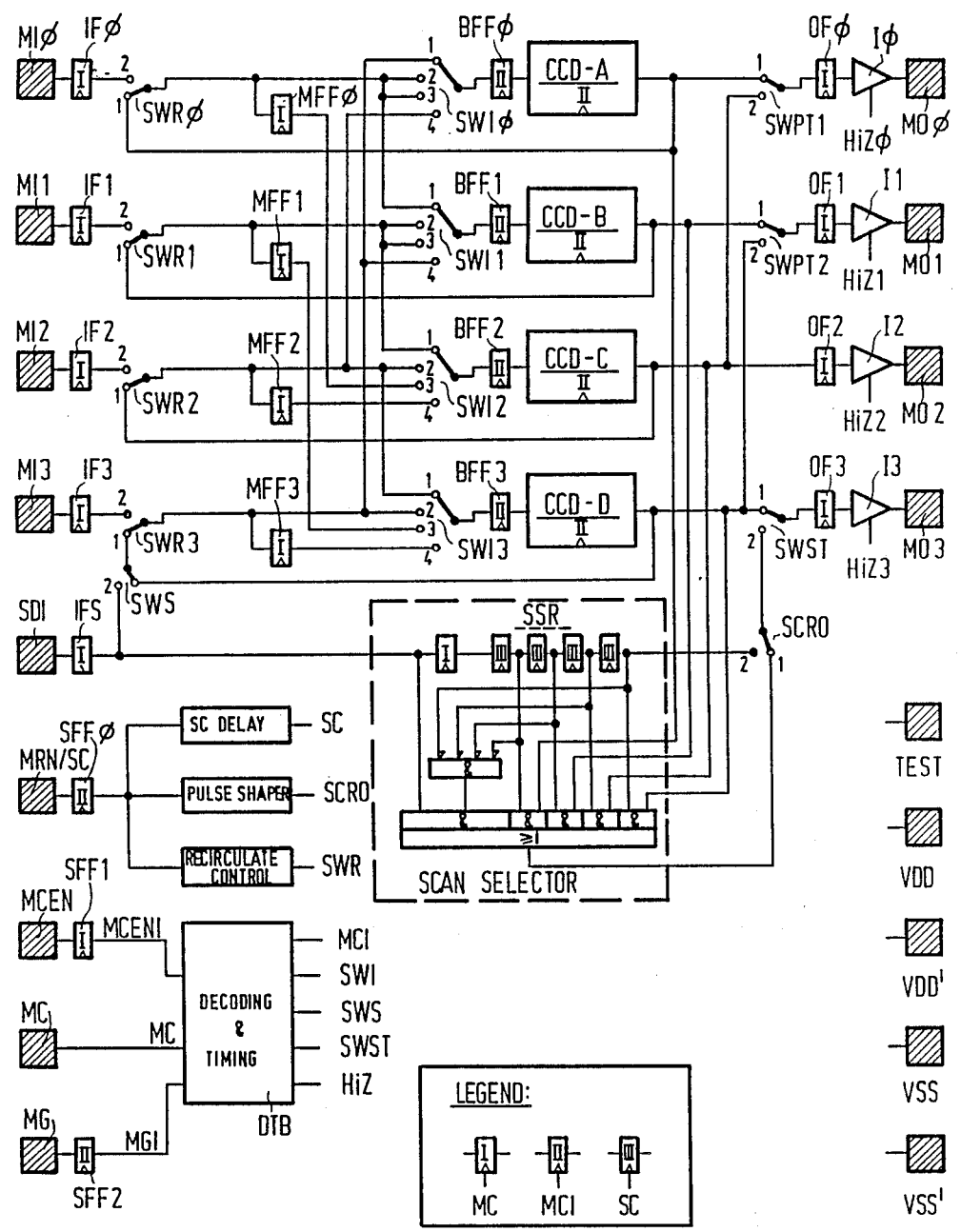

The integrated memory device shown in FIG. 1 comprises four memory sections CCD-A, CCD-B, CCD-C, CCD-D, each of which can contain 208 kb of information. The integrated memory device in accordance with the invention is accommodated in a 20-pin envelope whose pins have the following connection distribution: four terminals receive input signals MI0 to MI3; four terminals supply output signals MO0 to MO3; two terminals receive a positive supply voltage VDD (one for the memory itself and one for the control logic); two terminals receive a negative supply voltage VSS (one for the memory and one for the control logic); four terminals receive control signals MC, MCEN, MG, MRN/SC for controlling the integrated memory device, which four control signals include inter alia the high-frequency clock pulse signal MC. There are also provided an input terminal SDI for the supply of serial data and a terminal TEST for test purposes. Two connection terminals are not used. The connection terminal for test purposes is not relevant for the description of the invention; the four connection terminals VDD, VDD', VSS and VSS' are not relevant either. The basic idea of the memory device shown in the block diagram concerns the operation of the four memory sections in different modes as well as the switching means required. The switching means comprise four switches SWR0 to SWR3, four switches SWI0 to SWI3, two switches SWPT1 and SWPT2, one switch SWS, one switch SWST and further swith selection means SSR which will be described in detail hereinafter. The switches and the switch selection means are controlled by means of control signals which are applied inter alia to a decoding and timing block DTB and which are supplied via the input terminals MG, MC, MCEN, MRN/SC and SDI. The activation of the switching means and the switch selection means by the control signals, will be described in detail hereinafter.

In the position 1 of the switches SWI0 to SWI3 the four memory sections CCD-A to CCD-D are connected in series. As appears from the Figure, the output of the memory section CCD-A is connected to the input of the memory section CCD-B via the switch SWR0 and the input 1 of the switch SWI1. Similarly, the output of the memory section CCD-B is connected, via the switch SWR1 and the switch SWI2, to the input of the memory section CCD-C. The output of the memory section CCD-C is connected via the switch SWR2 and the switch SWI3, to the input of the fourth memory section CCD-D, the output of which is connected to the input of the section CCD-A via the switches SWS and SWR3 and via SWI0. However, the switch SWS is then switched from the position 1 shown to the position 2; serial data can then be applied to the memory section CCD-A via the input terminal SDI. Because the memory sections CCD-A to CCD-D are connected in series, serial data can be applied to the memory sections, via the terminal SDI, in order to fill all memory sections. Via the output of the memory section CCD-D and the switch SWST, the information can be read again via the output terminal MO3. When the switches SWR0 to SWR3 are set to the position 2, like the switches SWI0 to SWI3, the four memory sections CCD-A to CCD-D can be used in parallel. Each memory section i is connected to an associated input terminal MIi and to an associated output terminal MOi, where $0 \leq i < 3$. The information applied to the input terminals MI0 to MI3 is clocked in input flipflops IF0 to IF3, for which purpose these input flipflops IF0 to IF3 receive the clock pulses MC. Via the switches SWR0 to SWR3, set to the position 2, the information is transferred to the buffer flipflops BFF0 to BFF3 via the switches SWI0 to SWI3 which have also been set to the position 2. To this end the buffer flipflops BFF0 to BFF3 receive a clock pulse MCI which is divided from the clock pulse MC. The purpose of the buffer flipflops BFF0 to BFF3 will be described in detail hereinafter. The information clocked in the memory sections can be read on the output which for this purpose is connected to the output flipflops OF0 to OF3, the output of which is connected to an output amplifier I0 to I3. The outputs of the output amplifiers I0 to I3 are connected to the output terminals MO0 to MO3. The output amplifiers I0 to I3 can be set to a high-impedance mode by a control signal on the inputs HIZ0 to HIZ3. The purpose is to create the possibility of parallel-connection of several integrated memory devices as shown in FIG. 1 to a data bus.

In a third mode (demultiplex), information is applied, via the input terminal MI0 and the input terminal MI1, to the memory sections CCD-A and CCD-C, and CCD-B and CCD-D, respectively. The information presented to the input terminal MI0 is clocked in, via the input flipflop IF0, by means of the clock pulses MC. This information is subsequently taken up by the flipflop MFF0 which also receives the clock pulses MC. The switches SWI0 to SWI3 are set to the position 3, so that the flipflops BFF0 and BFF2 are connected to the input flipflop IF0 and the flipflop MFF0, respectively. The buffer flipflops BFF0 and BFF2 receive clock pulses MCI having a pulse frequency which amounts to half the pulse frequency of the clock pulses MC. Hereinafter it will be described in detail how the clock pulses MCI are derived from the clock pulses MC. As a result of this control, a first data bit is applied to the buffer BFF2, via MFF0 and the switch SWI2, a second data bit being applied to BFF0 when the clock pulse MCI activates the buffer flipflops BFF0 and BFF2. As a result of the foregoing, the data stream on the terminal MI0 is applied to the memory sections CCD-A and CCD-C in a demultiplex mode. Similarly, the data stream is applied, via the input terminal MI1 and the input flipflop IF1, to the buffer flipflop BFF1 associated with the memory section CCD-B and, via the multiplex flipflop MFF1, to the buffer flipflop BFF3 associated with the memory section CCD-D. The data applied to the memory sections CCD-B and CCD-D via the demultiplexer circuit is applied, via a multiplex switch SWPT2, to an output flipflop OF1 which applies, via an output amplifier I1, the data to the output terminal MO1. The multiplex switches SWPT1 and SWPT2 are controlled by the same clock MCI applied to the buffer flipflops BFF0 to BFF3.

When the switches SWR0 to SWR3 are set to the position 1 and the switches SWI0 to SWI3 are set to the position 2, the memory sections CCD-A to CCD-D will operate in parallel in the circulation mode.

A further mode, in which the memory device in accordance with the invention can operate is formed by the so-called scan mode in which the memory sections CCD-A to CCD-D are scanned one by one. In this scan mode one of the outputs of the four memory sections CCD-A to CCD-D is connected, via the switch selection means SSR, to the output MO3, via the switch SCR0 which then occupies the position 1, and via the switch SWST which is in the position 2. Moreover, during the scan mode the serial data input SDI can be connected, via the switch selection means SSR, to the output MO3. The reasons for adding this direct connection of the input terminal SDI to the output terminal MO3 to the memory device in accordance with the invention will be explained hereinafter.

In the scan mode the outputs of the memory sections CCD-A to CCD-D are connected one-by-one to the output terminal MO3 via the switch selection means SSR. Therefore, the switch selection means SSR comprise a series connection of five flipflops, a first one of which is denoted by the reference I and is driven by the clock signal MC, the others being driven by a control pulse SC. The control pulse SC is applied from the environment, via the input terminal MRN/SC and via the flipflop SFF0 which is clocked, using control pulses MCI, to a delay element SC-DELAY. The input of the flipflop driven by the clock pulses MC is connected to the input terminal SDI via the flipflop IFS. Each output of the four flipflops driven by the control pulse SC is connected to an associated AND-gate, a second input of which is connected to an associated output of the memory sections CCD-A to CCD-D. The outputs of the four flipflops driven by the control pulse SC are also connected to inverting inputs of a four-input AND-gate, the output of which is connected to the input of a further two-input AND-gate. The second input of the further AND-gate is connected to the input terminals SDI. The four-input AND-gate, connected to the five-input OR-gate via the further AND-gate, controls the connection of the serial input SDI to the output terminal MO3 (via the switches SCR0, SWST and via the output flipflop OF3 and the output buffer I3). Said connection is realized if each of the inputs of the four-input AND-gate has the logic value zero.

The operation of the switch selection means SSR in the scan mode of the memory device is as follows. For the sake of simplicity it is assumed that a scan bit having a logic value "1" is stored in the scan flipflop connected to the flipflop driven by the clock pulses MC and that the logic value "0" is stored in the other three flipflops. Via the AND-gate connected to this flipflop, data is conducted from the memory section CCD-A, being driven by the control pulses MC, to the output terminal MO3. After the reading of the memory section CCD-A, the scan bit can be shifted to the next flipflop by applying a control pulse SC to the four flipflops. The scan bit will then be present in the second flipflop so that the data is transferred from the memory section CCD-B to the output MO3 via the associated AND-gate. Similarly, after the reading of the memory section CCD-B, the scan bit is shifted to the third flipflop under the control of the control pulse SC after which the memory section CCD-C is read and the data stored therein is applied, via the AND-gate associated with the third flipflop and with the memory section CCD-C, to the output terminal MO3. After a next control pulse SC, the scan bit will be present in the fourth flipflop and the data is read from the fourth memory section CCD-D and applied to the output terminal MO3 via the associated AND-gate.

When a control pulse SC is generated via the input terminal MRN/SC and the time delay element SC-DELAY, a pulse-shaped switch control signal SCR0 is generated in parallel via the pulse generator. This switch control signal SCR0 controls the switch SCR0 which is thus briefly set to the position 2. The output signal of the fourth flipflop, being driven by the control pulse SC, is then applied to the output MO3 via the switch SWST. This output signal remains zero until the scan bit has been stored in the fourth flipflop after a sufficient number of control pulses SC. When several memory devices as shown in FIG. 1 as used for the storage of many pages of teletext information, the output MO3 of one memory device is connected to the serial data input SDI of the next memory device. In the given situation in which the scan bit is stored in the fourth flipflop and the switch pulse SCR0 is generated, the scan bit will be stored, in response to a next clock pulse MC, via the output MO3 from one memory device and via the input SDI of the other memory device connected thereto, in the flipflop, also driven by the clock pulse MC, of the switch selection means SSR of the other memory device. As a result of this set-up, in response to a next control pulse SC the scan bit will be stored in the first flipflop, driven by the control pulse SC, of the switch selection means SSR of said other memory device, so that the memory section CCD-A thereof can be read, etc.

In the one memory device, having "delivered" the scan pulse, each flipflop driven by the control pulse SC then contains the logic value "0"; this is detected by the four-input AND-gate. The output of the four-input AND-gate is applied, together with the input SDI, for the further two-input AND-gate in order to connect the input SDI directly to the output MO3 (via the various flipflops and the output amplifier) in this situation. The memory device thus becomes "transparent" as it were.

It is to be noted that the switches SWR0 to SWR3, SWI0 to SWI3, SWPT1, SWPT2, SWS, SCR0 and SWST are also realized by means of logic AND-gates or OR-gates, like the switch selection means SSR.

Figure 2:
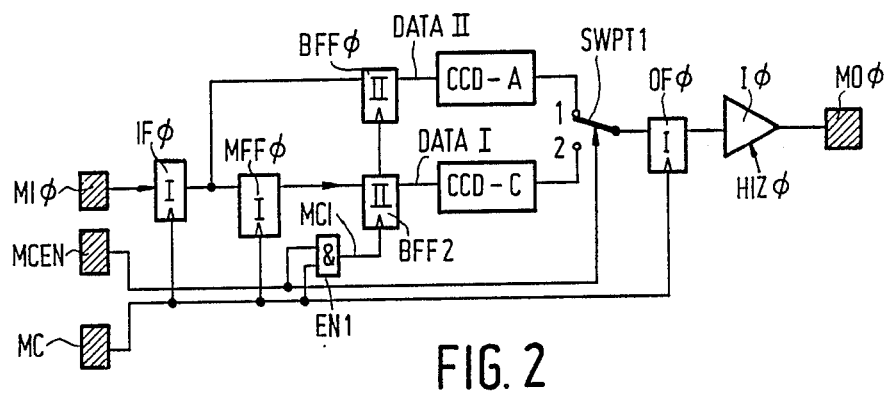

FIG. 2 is a simplified representation of a part of the memory device in accordance with the invention which operates in the time multiplex mode. FIG. 2 shows that the data on the input terminal MI0 is applied to the input flipflop IF0 which receives the clock pulses MC. The output of the input flipflop IF0 is connected to an input of the buffer flipflop BFF0 as well as to input of an intermediate flipflop MFF0 which also receives the clock pulses MC. The output of the intermediate flipflop MFF0 is connected to the input of the buffer flipflop BFF2. The two buffer flipflops BFF0 and BFF2 receive the clock pulses MCI. The clock pulses MCI are derived, via an AND-gate EN1, from the clock pulses MC and the inverted clock pulse series MCENI presented to the input terminals MC and MCEN, respectively, of the memory device. The outputs of the buffer flipflops BFF0 and BFF2 are connected to the inputs of the memory sections CCD-A and CCD-C, respectively. The outputs of the memory sections CCD-A and CCD-C are connected, via a switch SWPT1, to an input of an output flipflop OF0 which conducts the data to an output amplifier I0, the output of which is connected to an output terminal MO0. The output flipflop OF0 receives the clock pulses MC.

Figure 3:
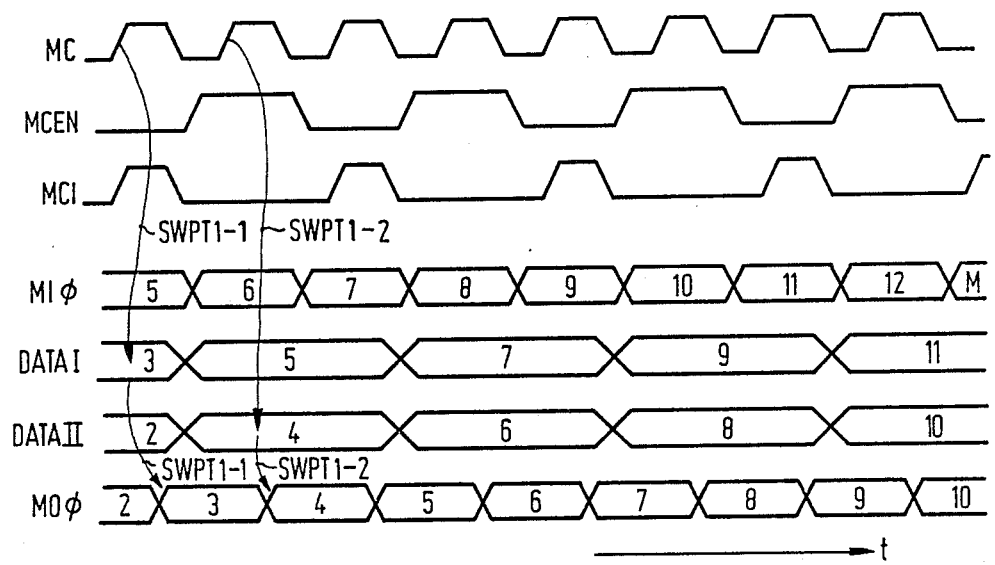

The simplified diagram of FIG. 2 will be described with reference to the time diagram of the various signals occurring in FIG. 2 which are shown in FIG. 3. The clock pulses MC are represented in the upper diagram of FIG. 3. The clock pulses MC have a frequency of, for example 30 MHz. Using the clock pulses MC, data is clocked from the terminal MI0 into the memory device shown via the input flipflop IF0. The data thus entered must be distributed between the two memory sections CCD-A and CCD-C. This distribution is realized by supplying the input terminal MCEN with a pulse series whose the frequency amounts to half the clock pulse frequency of the clock pulses MC. The two clock pulse series MC and MCEN are applied to an AND-gate EN1, the clock pulses MCEN thus being inverted (not shown). The output signal of the AND-gate EN1 is formed by a clock signal MCI, the pulse frequency of which amounts to half the frequency of the clock pulses MC. The pulses MCI are applied to the buffer circuits BFF0 and BFF2. Because the input data is applied directly to BFF0 and, via MFF0, to BFF2, a first data signal which is stored in the intermediate flipflop MFF0 is stored each time in the buffer flipflop BFF2, a second data signal presented to the input of the intermediate flipflop MFF0 being transferred to the buffer flipflop BFF0. Thus, data having an odd index is applied to the memory section CCD-C and data having an even index number is applied to the memory section CCD-A. In FIG. 3 this is represented by dividing the signal on the input terminal MI0 into blocks with dat ascending from 5, 6, 7, 8, 9 etc.; the next line shows that the data having an odd index number 3, 5, 7, 9, 11 etc. is applied to the memory section CCD-C via the connection line DATAI; the connection line DATAII to the memory section CCD-A shows, in the last line but one of FIG. 3, that the even data 2, 4, 6, 8, 10 etc. is applied to the respective memory section CCD-A. The outputs of the memory sections CCD-A and CCD-C are applied, via a switch SWPT1, to the output flipflop OF0. The switch SWPT1 is switched at a pulse frequency which is determined by the pulses applied to the terminal MCEN of FIG. 2. For the sake of simplicity it is assumed that the input DATAI and DATAII of the two memory sections CCD-C and CCD-A are directly connected to the terminals 1 and 2, respectively, of the switch SWPT1. It can be derived from FIG. 3 that, when the switching pulse MCEN is logic high, the switch terminal 2 is connected to the input of the output buffer OF0 so that the data then present on the line DATAI, being DATA having the index number 3, is applied to the output flipflop OF0 which at that instant receives a clock pulse MC so that this output flipflop OF0 takes over the data having the index 3. The foregoing is illustrated in FIG. 3 by means of the two arrows SWPT1-1. During a next half period of the clock pulse MCEN, this pulse is high and the terminal 1 of the switch SWPT1 is connected to the input of the output flipflop 0 in response to the next positive edge of the clock pulse MC. In response to the next positive edge of the clock signal MC, the data having the index number 4 is taken over in the output flipflop OF0. The foregoing is illustrated again in the FIG. 3 by means of the arrows SWPT1-2.

It is to be noted that the deriving of the clock pulses MCI by means of the AND-gate EN1 is a simplification of the reality. The drawback of the AND-gate EN1 shown consists in that the input signal on the terminal MCEN must be low before the clock pulse signal MC exhibits a positive edge and must remain low until the clock pulse MC has had a negative edge again; in other words, the signal on the terminal MCEN may change only when the clock pulse signal MC has the logic low level. Generally, this timing requirement is difficult to fulfill.

Figure 4:
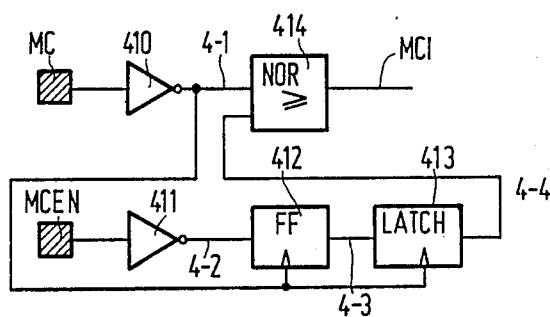

The above problem is solved in the internal pulse generator circuit shown in FIG. 4. In the clock pulse suppression circuit shown in FIG. 4, inverters 410 and 411 are connected to the input terminals MC and MCEN. The output of the inverter 411 is connected to an input of a flipflop 412, the output of which is connected to a latch 413. The output of the inverter 410 is connectd to clock pulse inputs of the flipflop 412, the latch circuit 413, and an input or a NOR-gate 414 whereto an output of the latch circuit 413 is also connected. The output of the NOR-gate circuit 414 produces the desired signal MCI, as will be described hereinafter.

Figure 5:
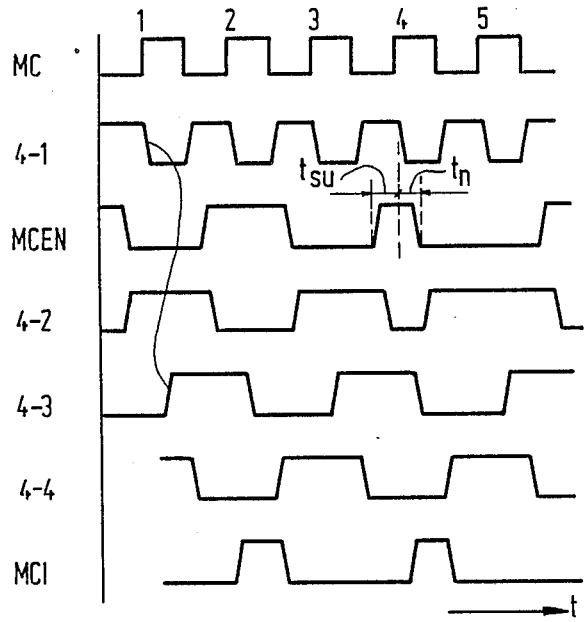

The first and the third line in FIG. 5 show the input signals MC and MCEN, respectively, as a function of time, which signals MC and MCEN are applied to the circuit shown in FIG. 4. The outputs of the inverters 410 and 411 supply the signals denoted by the index 4-1 and 4-2, respectively. The flipflop 412 is triggered by a negative-going edge, so that the value of the signal 4-2 is transferred to the flipflop 412 in response to the negative-going edge of the signal having the index 4-1. This results in the signal 4-3 on the output of the flipflop 412, which output is transparent upon reception of a high clock signal, so that in response to a positve-going edge of the signal having the index 4-1, the logic value of the signal 4-3 on the output of the latch circuit 4-4 is applied, which logic value is maintained when the clock signal applied to the latch circuit 413 changes from the high to the low logic level. The signals 4-1 and 4-4 applied to the NOR-gate 414 produce the signal MCI which is actually the signal MC in which every second pulse has been suppressed.

Figure 6:
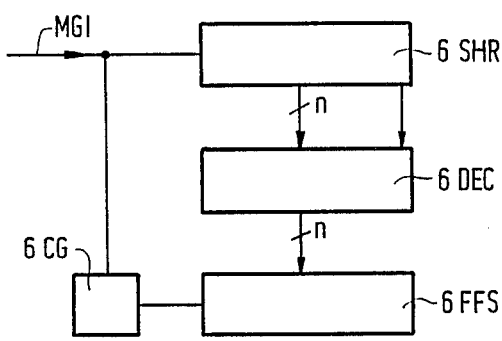
FIG. 6 shows a block diagram of the decoding and timing block DTB of FIG. 1.

FIG. 6 shows a block diagram of a substantial part of the decoding and timing block DTB of FIG. 1. The decoding and timing block DTB comprises an n-bit shift register 6SHR, a decoding circuit 6DEC and a hold circuit 6FFS. The shift register 6SHR comprises, for example 6 flipflop circuits, the 6 outputs of which are connected to the decoding circuit 6DEC. The various outputs of the decoding circuit 6DEC are connected in parallel to inputs of the hold circuit 6FFS comprising a plurality of flipflop circuits. The input of the shift register 6SHR is connected to the input flipflop SFF2 of FIG. 1 and receives the signal MGI. The signal MGI is also applied to a control gate 6CG, an output of which controls the hold circuit 6FFS.

Figure 7A:
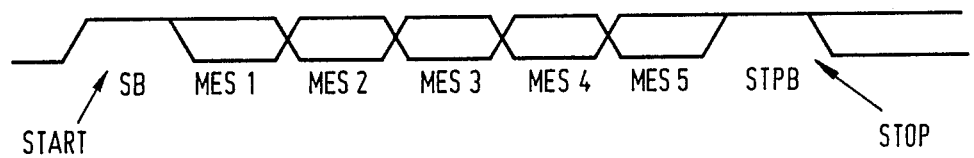
FIGS. 7a and 7b show time-pulse diagrams of the signals occurring in the decoding and timing block, and FIGS. 8a and b show a detailed diagram of the decoding and timing block and logic tables respectively.
Figure 7B:
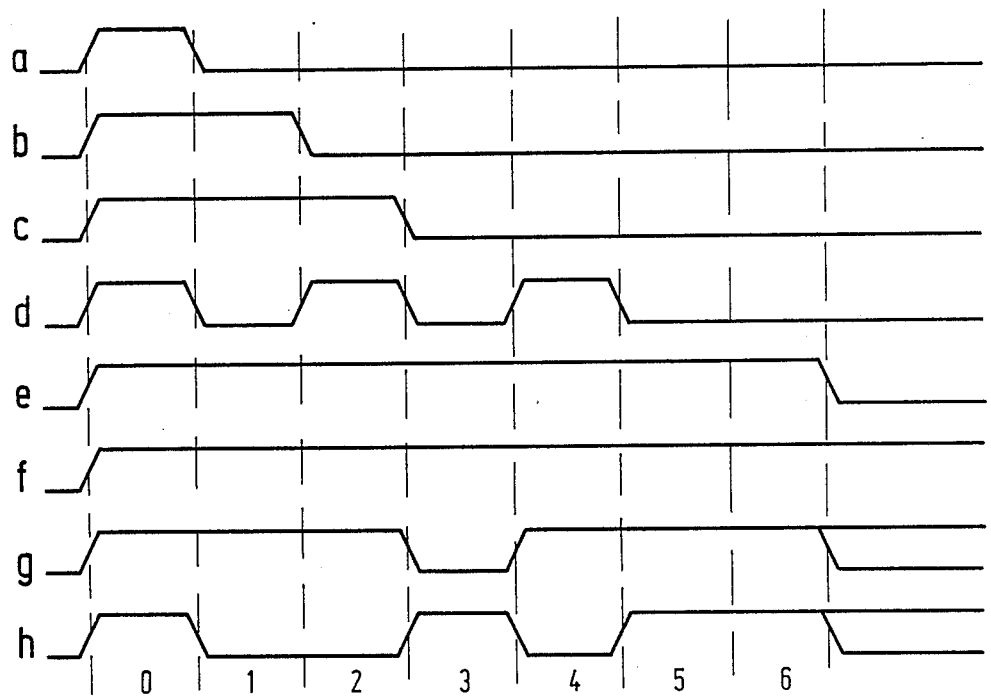

The operation of the decoding and timing block DTB whose block diagram is shown in FIG. 6 is as follows. Via the input MGI, a seven-bit control word is applied to the shift register 6SHR. The control word is shown in FIG. 7a and comprises a start bit SB which is followed by five message bits MES1 to MES5 and a stop bit STPB. The control gate 6CG comprises, for example an 8-bit counter which is reset by the positive-going edge of the start bit. After 7 bits have been counted down under the control of the clock pulses MC, the control circuit 6CG applies a trigger pulse to the hold circuit 6FFS which then takes over the decoded mode selection signal presented at that instant on the outputs of the decoder circuit 6DEC and retains this signal until a next trigger pulse appears from the control circuit 6CG. The control word used for adjusting the operation of the memory shown in FIG. 1 need not necessarily comprise 7 bits, as will be explained hereinafter with reference to the examples shown in FIG. 7b. FIG. 7b shows various control words a to h. In the example a in FIG. 7b, the control word comprises only the start bit "1" which is followed by a logic "low" signal which has a length of at least six bits (duration six clock pulses). In this case the switches SWR0 to SWR3 in the memory device shown in FIG. 1 are set to the position 2 and the switches SWI0 to SWI3 are set to the position 2, the switches SWPT1 and SWPT2 being switched to the position 1, like the switch SWST. The various memory sections CCD-A to CCD-D then operate in parallel, so that a 4-bit wide data stream is formed through the memory device from the input terminals MI0 to MI3 to the output terminals MO0 to MO3. This mode of operation of the memory device is referred to as the default mode. The same default mode is adjusted when the control word does not contain a stop bit STBP in the position of the seventh bit. This is represented by the examples b to d in FIG. 7b. The default mode is also activated when all message bits MES1 to MES5 between the start bit SB and the stop bit STBP have the logic value "1". This situation is shown in the examples e and f of FIG. 7b. In the example g of FIG. 7b, a logic low bit is issued during the message bit MES3. Furthermore, the message bits MES1, MES2, MES4 and MES5 have the logic value 1, like the start bit and the stop bit, so that a "valid" control word has been received. The given control word ensures that the memory device is switched to the serial mode, which means that in FIG. 1 the switches SWR0 to SWR3 are set to the position 1, the switches SWI1 to SWI3 are set to the position 1, and the switch SW5 is set to the position 1. The data in the four memory sections CCD-A to CCD-D will then circulate through the four memory sections and can be read, for example via the terminal MO0 if the switch SWPT is in the position 1.

In the example h of FIG. 7b, the start bit SB and the stop bit STPB are high, and so are the message bits MES3 and 5. The message bits MES1, MES2 and MES4 are low, so that different modes are combined. In the example h in FIG. 7b the memory operates as follows: 258 TV lines (for the 525 TV line system), high impedance state for the output buffers, parallel mode, time multiplexed data input and output via the inputs MI0 and MI1. The adjustment of the memory device for 258 TV lines or 290 TV lines for the 525 and the 625 TV line systems, respectively, is described in a previously filed Netherlands Patent Application No. 8701030 in the name of N. V. Philips' Gloeilampenfabrieken (PHN 12.109).

Figure 8A:
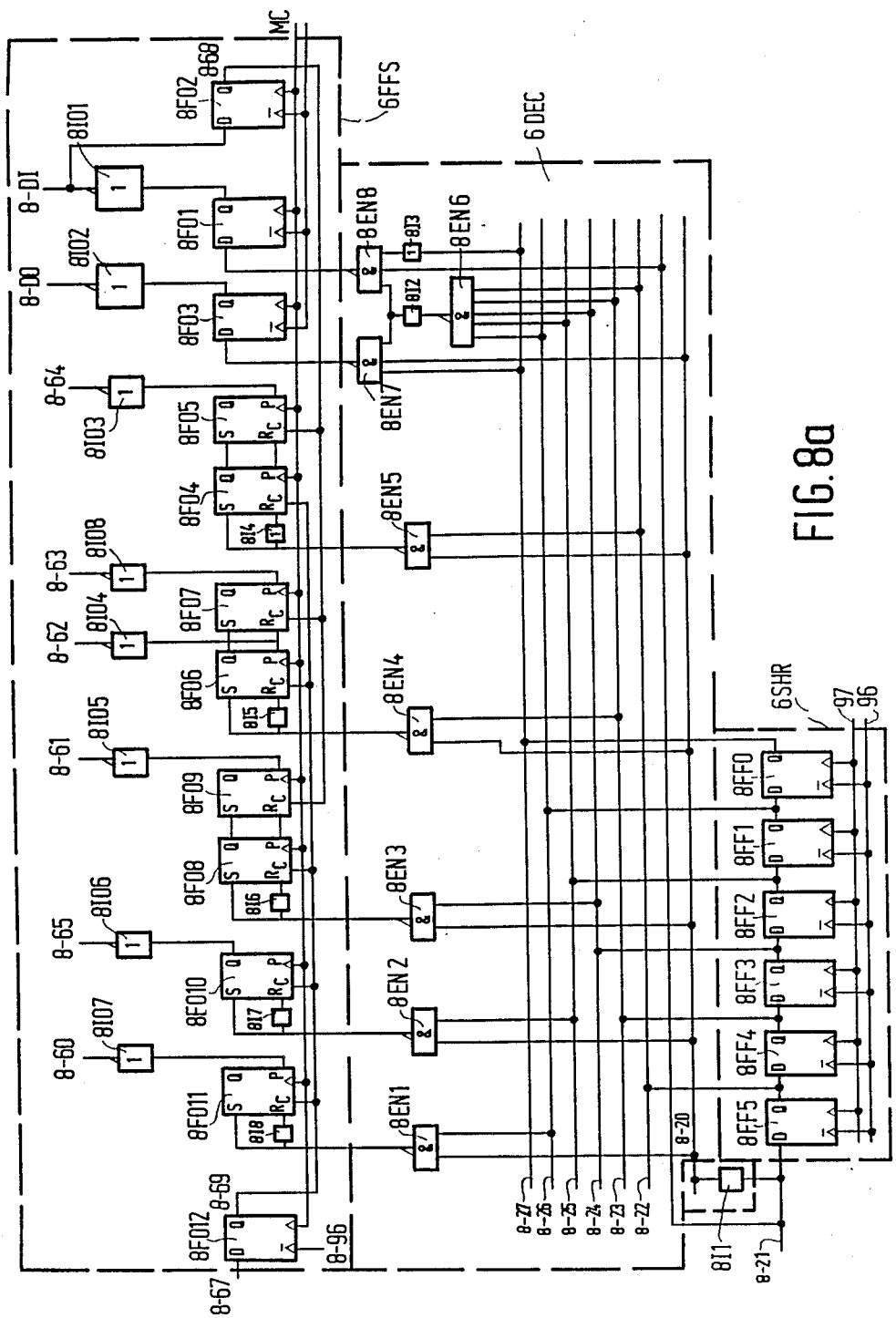

FIG. 8a is a more detailed representation of the decoding and timing block DTB of FIG. 1. The various components as shown in FIG. 6 are denoted by the same reference numerals. The shift register 6SHR comprises a series connection of 6 flipflop circuits 8FF0 to 8FF5. The outputs of the flipflop circuits 8FF0 to 8FF5 are connected to the decoding lines 8-27 to 8-22, respectively. The input 8-21 of the decoding and timing block DTB also forms a further decoding line 8-21 and an output of an inverter 8I1 is connected to a decoding line 8-20. The decoding lines 8-20 to 8-27 form part of the decoding circuit 6DEC which also comprises NAND-gates 8EN1 to 8EN8 and two inverters 8I2 and 8I3.

The NAND-gates 8EN1 to 8EN8 and the inverters 8I2 and 8I3 are connected to the decoding lines 8-20 to 8-27 so that the modes START-OUTPUT, START-INPUT, DATA IN A/B, MUXED DATA, SERIAL MODE, HiZ and/or 258/290 LINES shown in the table I of FIG. 8b are selected on the basis of the logic values given in matrix form below the decoding line numbers 8-21 to 8-27. It is to be noted that these logic values have been inverted with respect to the values used in the examples shown in the FIGS. 7a and b, because the signals on the terminal MG (see FIG. 1) are inverted (SFF2) and applied as the signal MGI to the decoding and timing block DTB via the input 8-21. In FIG. 8b a "0", a "1" and a "*" mean a logic low value, a logic high value, and a don't care value, respectively (it follows therefrom that the combination of modes is possible). It is to be noted that the logic value of the decoding line 8-20 is not included in the Table I because it carries the inverted logic signal of the decoding line 8-21. A mode can be selected only after a start bit SB and five message bits MES1 to MES5 are followed by a stop bit having the logic value "1". Therefore, all NAND-gates 8EN1 to 8EN7 are connected to the decoding line 8-20 (via the NAND-gate 8EN8 to the decoding line 8-21).

The hold circuit 6FFS comprises a number of flipflop circuits 8FO1 to 8FO11, a number of inverters 8IO1 to 8IO7, and some inverters 8I4 to 8I8 for inverting the signals originating from the decoding circuit 6DEC and generated by the NAND-gates 8EN1 to 8EN8. On the clock inputs the flipflop 8FO12 receives the clock pulses MC and the inverted forms thereof (on input 8-96) and on its data input 8-67 it receives the trigger signal from the control circuit 6CG. To the output 8-69 of the flipflop 8FO12 there are connected the control inputs of the flipflops 8FO11, 8FO10, 8FO8, 8FO6 and 8FO4, so that these flipflops, in response to the reception of a clock pulse MC, take over the logic values presented thereto by the AND-gates 8EN1 to 8EN5.

Using the AND-gate 8EN6, the inverters 8I2 and 8I3, and the AND-gate 8EN8 a START-INPUT is decoded (see FIG. 8b) which is taken over by the flipflop 8FO1 and the inverted form thereof is taken over by the flipflop 8FO2 via the inverter 8IO1. The output 8-68 of the flipflop 8IO2 is connected to the control inputs of the flipflops 8FO5, 8FO7 and 8FO9, so that in response to a valid DATA-INPUT the associated flipflop, determining the various positions of the switches SWR0 to SWR3, SWI0 to SWI3, SWS, SWPT1 and SWPT2 and SWST (see FIG. 1) in the various modes, will take over the logic state of the respective flipflop 8FO4, 8FO6 and 8FO8, respectively, in response to a next clock pulse MC. The output 8-60 of the flipflop 8FO11 determines whether the 258-line mode or the 290-line mode is adjusted. The output 8-65 of the flipflop 8FO10 determines whether or not the output buffers I0 to I3 are adjusted to a high output impedance state. The output 8-61 of the flipflop 8FO9 determines whether the memory device is connected in the serial mode. The outputs 8-62 and 8-63 of the flipflops 8FO6 and 8FO7 determine whether or not the data input and output take place in demultiplexed and a multiplexed form. The output 8-64 of the flipflop 8FO5 determines for which inputs MI0, MI1 or MI2, MI3 the data input is performed in demultiplexed form (in the case of logic "0": MI0, MI1; in the case of logic "1": MI2, MI3). The switches SWPT1 and SWPT2 are switched over in the rhythm of the control pulses MCI when the signal 8-62 is active. The relation between the signals $\overline{SWR}$ (the inverse of the signal SWR), 8-61, 8-63 and 8-64 and the positions of the switches SWIi, SWR, SWS and SWST is given in the FIG. 8b table II, in which a logic "1" indicates that the switch is in the relevant indicated position.

What is claimed is:

1. A multi-mode memory device of the charge-coupled shift register type for the storage of picture information, comprising:
a plurality of series/parallel/series organized memory sections which, at least in a first, second, and third mode of the memory device, are connected in a recirculation mode, in a serial mode, and in a parallel-in/parallel-out mode, each memory section having its own input terminal respectively;
fully integrated switching means, which switching means comprise a decoding and timing circuit for receiving a multibit control word serially applied to an input terminal of the integrated memory device and for switching the integrated memory device to a mode which is determined by the control word.

2. A memory device as claimed in claim 1, characterized in that the memory device also has a demultiplex/multiplex mode, data applied to an input terminal being successively applied to at least two memory sections which can also be read in the multiplex mode and whose stored data is successively applied to an output terminal.

3. A memory device as claimed in claim 1 or 2, characterized in that the decoding and timing circuit comprises a shift register for receiving a multi-bit control word and a decoding circuit which is connected to outputs of the shift register for the selection of the function mode of the memory device.

4. An integrated memory device as claimed in claim 3, characterized in that the memory device has a scan mode in which an output of the memory sections to be successively read is sequentially connected to the same input of the integrated memory device.

5. A memory device as claimed in claim 3, characterized in that the decoding and timing circuit comprises an input which is connected to an input terminal for taking up picture data to be serially entered into the integrated memory device.

6. An integrated memory device as claimed in claim 5, characterized in that for controlling the memory device in the scan mode the memory device comprises a scan register in which a scan bit can be stored in successive locations, the location of the scan bit determining which memory section can be read, an input and an output of the scan register being connectable to the input for receiving serial data and to an output of the memory device, respectively.

7. An integrated memory device as claimed in claim 6, characterized in that the outputs of the scan register are connected to an input of the same AND-gate, the input for receiving the serial data being connected to a further input of the relevant AND-gate, an output of which is connected to an output terminal.

8. An integrated memory device as claimed in claim 2, characterized in that the memory device has a scan mode in which an output of the memory sections to be successively read is sequentially connected to the same input of the integrated memory device.

9. An integrated memory device as claimed in claim 1, characterized in that the memory device has a scan mode in which an output of the memory sections to be successively read is sequentially connected to the same input of the integrated memory device.

10. The memory device of claim 1 comprising recirculation switching means responsive to the control word for connecting each of the memory sections in a recirculation mode.

11. The memory device of claim 10 comprising input switching means responsive to the control word for connecting the memory sections in one of a series mode, a parallel mode, a data input or a recirculation mode, depending upon the position of the recirculation switching means, a demultiplex mode, and a scan mode.

* * * * *

UNITED STATES PATENT AND TRADEMARK OFFICE
CERTIFICATE OF CORRECTION

PATENT NO. : 4,947,380

DATED : August 7, 1990

INVENTOR(S) : ADRIANUS T. VAN ZANTEN ET AL

It is certified that error appears in the above-identified patent and that said Letters Patent is hereby corrected as shown below:

Column 12, line 9, change "1" to --3--.

Signed and Sealed this

Sixth Day of July, 1993

Attest:

MICHAEL K. KIRK

*Attesting Officer*     *Acting Commissioner of Patents and Trademarks*

UNITED STATES PATENT AND TRADEMARK OFFICE
CERTIFICATE OF CORRECTION

PATENT NO. : 4,947,380
DATED : August 7, 1990
INVENTOR(S) : Adrianus T. Van Zanten, et al It is certified that error appears in the above-indentified patent and that said Letters Patent is hereby corrected as shown below:

Col. 12, line 9, change "3" to --1--.

This Certificate supersede Certificate of Correction issued July 6, 1993.

Signed and Sealed this

Twenty-eighth Day of December, 1993

Attest:

BRUCE LEHMAN

Attesting Officer     Commissioner of Patents and Trademarks